(12) United States Patent
Hung

(10) Patent No.: US 10,636,903 B2
(45) Date of Patent: Apr. 28, 2020

(54) SEMICONDUCTOR DEVICE

(71) Applicant: UNITED MICROELECTRONICS CORP., Hsin-Chu (TW)

(72) Inventor: Ching-Wen Hung, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/392,591

(22) Filed: Apr. 23, 2019

(65) Prior Publication Data
US 2019/0252544 A1 Aug. 15, 2019

Related U.S. Application Data

(63) Continuation of application No. 15/723,186, filed on Oct. 3, 2017, now Pat. No. 10,312,364.

(51) Int. Cl.
*H01L 23/52* (2006.01)
*H01L 29/78* (2006.01)
*H01L 21/8238* (2006.01)
*H01L 29/786* (2006.01)
*H01L 29/423* (2006.01)
*H01L 29/10* (2006.01)
*H01L 29/417* (2006.01)
*H01L 27/092* (2006.01)
*H01L 29/778* (2006.01)
*H01L 29/66* (2006.01)
*H01L 27/04* (2006.01)
*H01L 29/24* (2006.01)
*H01L 29/16* (2006.01)

(52) U.S. Cl.
CPC .. *H01L 29/7813* (2013.01); *H01L 21/823814* (2013.01); *H01L 27/04* (2013.01); *H01L 27/092* (2013.01); *H01L 29/1037* (2013.01); *H01L 29/24* (2013.01); *H01L 29/41733* (2013.01); *H01L 29/41766* (2013.01); *H01L 29/4238* (2013.01); *H01L 29/42384* (2013.01); *H01L 29/66045* (2013.01); *H01L 29/66969* (2013.01); *H01L 29/778* (2013.01); *H01L 29/78642* (2013.01); *H01L 29/78681* (2013.01); *H01L 29/78684* (2013.01); *H01L 29/1606* (2013.01)

(58) Field of Classification Search
None
See application file for complete search history.

(56) References Cited

U.S. PATENT DOCUMENTS

| | | | |
|---|---|---|---|
| 4,835,585 A | 5/1989 | Panousis | |
| 9,553,199 B2 | 1/2017 | Hou | |
| 2009/0166686 A1 | 7/2009 | Hunt | |
| 2014/0151777 A1 | 6/2014 | Sim | |
| 2015/0303299 A1 | 10/2015 | Chang | |

*Primary Examiner* — Calvin Y Choi
(74) *Attorney, Agent, or Firm* — Winston Hsu

(57) ABSTRACT

A semiconductor device includes a first dielectric layer on a substrate, a hard mask layer on the first dielectric layer, a trench in the hard mask layer and the first dielectric layer, a first source/drain electrode layer on a sidewall of the trench, a second dielectric layer on the first source/drain electrode layer in the trench, a second source/drain electrode layer on the second dielectric layer in the trench, a third dielectric layer on the second source/drain electrode layer in the trench, a 2D material layer overlying the hard mask layer, the first source/drain electrode layer, the second dielectric layer, the second source/drain electrode layer, and the third dielectric layer, a gate dielectric layer on the 2D material layer, and a gate electrode on the gate dielectric layer.

20 Claims, 16 Drawing Sheets

SEMICONDUCTOR DEVICE

CROSS REFERENCE TO RELATED APPLICATIONS

This application is a continuation of U.S. application Ser. No. 15/723,186 filed Oct. 3, 2017, which is included in its entirety herein by reference.

BACKGROUND OF THE INVENTION

1. Field of the Invention

The present invention relates generally to the field of semiconductor technology. More particularly, the present invention relates to a trench-type semiconductor device and a fabrication method thereof.

2. Description of the Prior Art

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon.

Transistors are circuit components or elements that are often formed on semiconductor devices. Many transistors may be formed on a semiconductor device in addition to capacitors, inductors, resistors, diodes, conductive lines, or other elements, depending on the circuit design. A field effect transistor (FET) is one type of transistor.

Generally, a transistor includes a gate stack formed between source and drain regions. The source and drain regions may include a doped region of a substrate and may exhibit a doping profile suitable for a particular application. The gate stack is positioned over the channel region and may include a gate dielectric interposed between a gate electrode and the channel region in the substrate.

SUMMARY OF THE INVENTION

It is one object of the invention to provide an improved semiconductor device with two-dimensional material layer.

According to one embodiment of the invention, a semiconductor device includes a substrate, a first dielectric layer on the substrate, a hard mask layer on the first dielectric layer, a trench in the hard mask layer and the first dielectric layer, a first source/drain electrode layer on a sidewall of the trench, a second dielectric layer on the first source/drain electrode layer in the trench, a second source/drain electrode layer on the second dielectric layer in the trench, a third dielectric layer on the second source/drain electrode layer in the trench, a two-dimensional (2D) material layer overlying the hard mask layer, the first source/drain electrode layer, the second dielectric layer, the second source/drain electrode layer, and the third dielectric layer, a gate dielectric layer on the 2D material layer, and a gate electrode on the gate dielectric layer.

According to another embodiment of the invention, a method for fabricating a semiconductor device is disclosed. A substrate having thereon an etch stop layer, a first dielectric layer on the etch stop layer, and a hard mask layer on the first dielectric layer is provided. A trench is formed in the hard mask layer and the first dielectric layer. A first source/drain electrode layer is formed on a sidewall of the trench. A second dielectric layer is formed to cover the first source/drain electrode layer in the trench. A second source/drain electrode layer is formed on the second dielectric layer in the trench. A third dielectric layer is formed on the second source/drain electrode layer in the trench. A two-dimensional (2D) material layer is formed overlying the hard mask layer, the first source/drain electrode layer, the second dielectric layer, the second source/drain electrode layer, and the third dielectric layer. A gate dielectric layer is formed on the 2D material layer. A gate electrode is formed on the gate dielectric layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
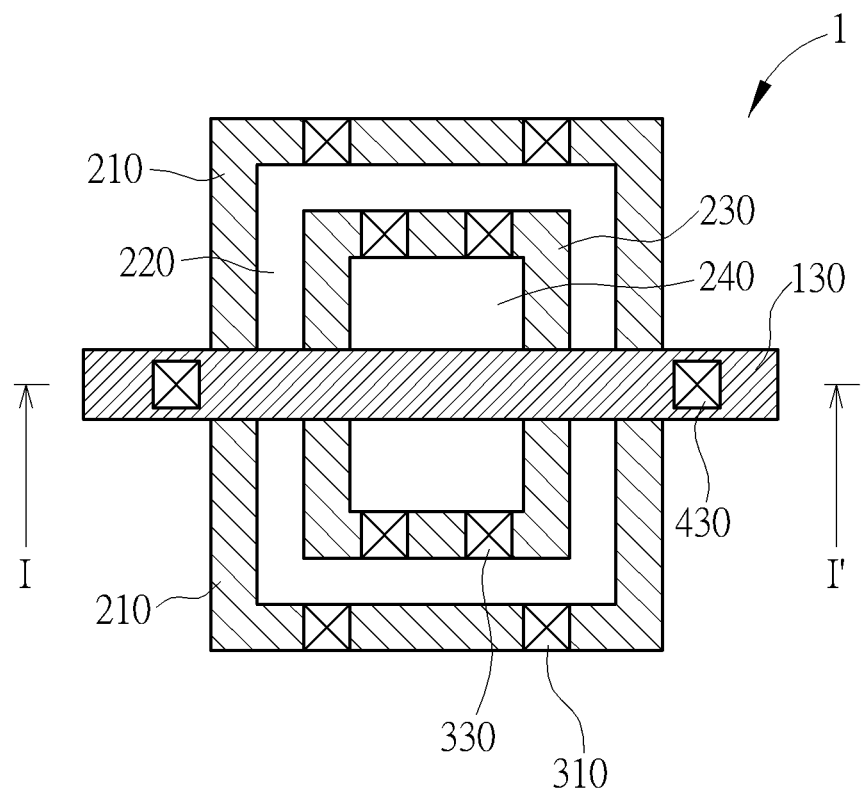
FIG. 1 is a schematic top view showing a semiconductor device according to one embodiment of the invention.

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention. Other embodiments may be utilized and structural changes may be made without departing from the scope of the present disclosure.

The following detailed description is, therefore, not to be taken in a limiting sense, and the scope of the present invention is defined only by the appended claims, along with the full scope of equivalents to which such claims are entitled. One or more implementations of the present invention will now be described with reference to the attached drawings, wherein like reference numerals are used to refer to like elements throughout, and wherein the illustrated structures are not necessarily drawn to scale.

As described in the embodiments herein, steps such as deposition, patterning or etching of various films (including conductive films, metals, dielectric layers, etc.) can be accomplished using known processes such as chemical vapor deposition, physical vapor deposition, sputtering, atomic layer deposition, optical lithography processes, plasma dry etching, wet etching, reactive ion etching, and the like, the details of which will not be repeated.

The present invention pertains to a trench-type semiconductor transistor device, which may be applicable to various technologies including, but not limited to, single-type transistors, transmission gate transistors, CMOS transistors, or common-gate inverter designs.

Figure 2:
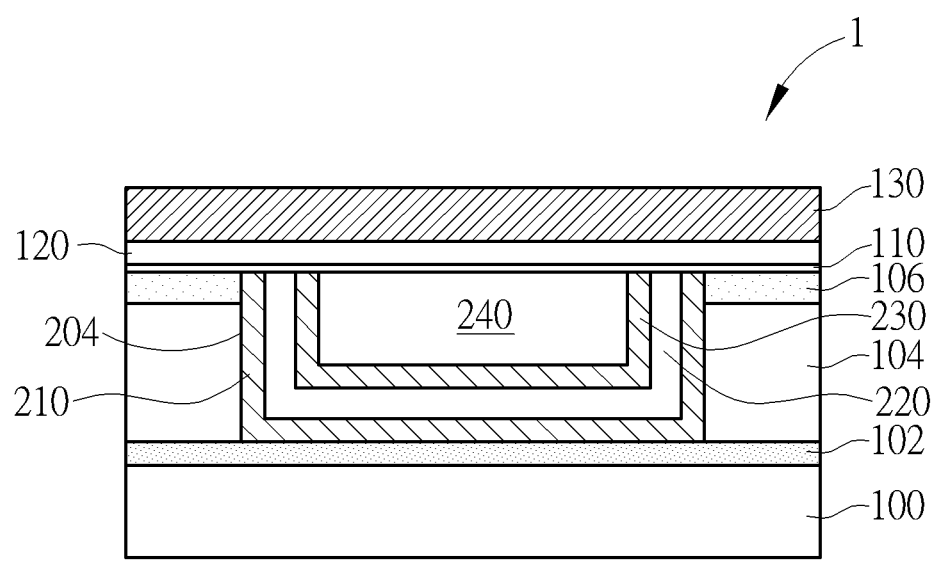
FIG. 2 is a cross-sectional view taken along line I-I' in FIG. 1.

Please refer to FIG. 1 and FIG. 2. FIG. 1 is a schematic top view showing a semiconductor device according to one embodiment of the invention. FIG. 2 is a cross-sectional view taken along line I-I' in FIG. 1. As shown in FIG. 1 and FIG. 2, the semiconductor device 1 comprises a substrate 100. According to one embodiment, the substrate 100 may be a semiconductor substrate such as a silicon substrate, a silicon-on-insulator (SOI) substrate, but is not limited thereto. It is understood that the substrate 100 may be composed of other suitable materials such as glass, ceramic, or metals.

A first dielectric layer 104 such as an inter-layer dielectric (ILD) layer may be formed on the substrate 100. According to one embodiment, the first dielectric layer 104 may comprise silicon oxide, but is not limited thereto. According to one embodiment, an etch stop layer 102 such as a silicon nitride layer may be provided between the substrate 100 and the first dielectric layer 104. According to one embodiment, a hard mask layer 106 such as a silicon nitride layer is formed on the first dielectric layer 104.

According to one embodiment, a trench 204 is formed in the hard mask layer 106 and the first dielectric layer 104. As can be seen in FIG. 1, the trench 204 may have a rectangular shape when viewed from the above. However, it is understood that the trench 204 may have other shapes, for example, circular shape or oval shape.

According to one embodiment, a first source/drain electrode layer 210 extends along a sidewall and a bottom of the trench 204. According to one embodiment, the first source/drain electrode layer 210 may comprise conductive materials, for example, metals or polysilicon, but is not limited thereto. The first source/drain electrode layer 210 conformally covers the sidewall and the bottom of the trench 204. The first source/drain electrode layer 210 is in direct contact with the hard mask layer 106 and the first dielectric layer 104 at the sidewall of the trench 204 and is in direct contact with the etch stop layer 102 at the bottom of the trench 204.

According to one embodiment, a second dielectric layer 220 is conformally deposited on the first source/drain electrode layer 210 in the trench 204. For example, the second dielectric layer 220 may be a silicon oxide layer, but is not limited thereto. A second source/drain electrode layer 230 such as a metal layer or a polysilicon layer is conformally formed on the second dielectric layer 220 in the trench 204. A third dielectric layer 240 such as a silicon oxide layer is deposited on the second source/drain electrode layer 230 in the trench 204. The second source/drain electrode layer 230 is insulated from the first source/drain electrode layer 210 by the second dielectric layer 220.

The first source/drain electrode layer 210, the second dielectric layer 220, the second source/drain electrode layer 230, and the third dielectric layer 240 completely fill up the trench 204. The third dielectric layer 240 has a top surface that is flush with a top surface of the hard mask layer 106. The top surface of the first source/drain electrode layer 210, a top surface of the second dielectric layer 220, a top surface of the second source/drain electrode layer 230, a top surface of the third dielectric layer 240, and a top surface of the hard mask layer 106 are coplanar.

As shown in FIG. 1, the first source/drain electrode layer 210 and the second source/drain electrode layer 230 are ring shaped and are concentrically arranged in the trench 204 around the third dielectric layer 230.

According to one embodiment, a two-dimensional (2D) material layer 110 overlies the hard mask layer 106, the first source/drain electrode layer 210, the second dielectric layer 220, the second source/drain electrode layer 230, and the third dielectric layer 240. According to one embodiment, the 2D material layer may comprise transition metal dichalcogenide, graphene, or boron nitride, but is not limited thereto.

According to one embodiment, the first source/drain electrode layer 210 extends vertically along the sidewall of the trench 204 between the 2D material layer 110 and the etch stop layer 102. A top surface of the first source/drain electrode layer 210 is in direct contact with the 2D material layer 110 and a bottom surface of the first source/drain electrode layer 210 is in direct contact with the etch stop layer 102.

According to one embodiment, a gate dielectric layer 120 is conformally deposited on the 2D material layer 110. For example, the gate dielectric layer 120 may be a silicon oxide layer, but is not limited thereto. According to one embodiment, a gate electrode 130 is disposed on the gate dielectric layer 120. For example, the gate electrode 130 may comprise metals or polysilicon, but is not limited thereto. The region between the first source/drain electrode layer 210 and the second source/drain electrode layer 230 that is directly under the gate electrode 130 constitutes a gate channel region.

As shown in FIG. 1, exemplary contact elements 310, 330 and 430 are disposed on the first source/drain electrode layer 210, the second source/drain electrode layer 230, and the gate electrode 130, respectively.

Figure 3:
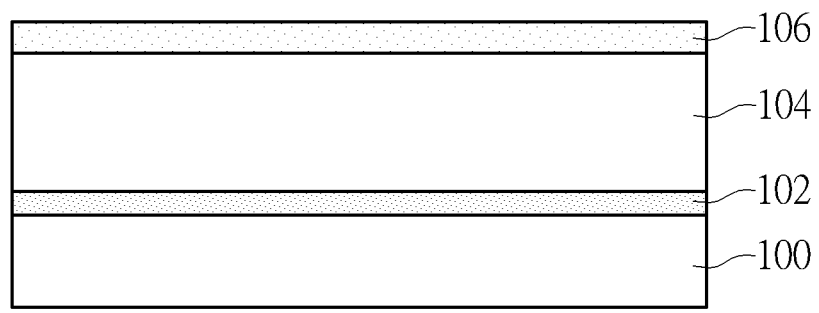
FIG. 3 to FIG. 7 illustrate an exemplary method for fabricating a semiconductor device according to one embodiment of the invention.

Please refer to FIG. 3 to FIG. 7. FIG. 3 to FIG. 7 illustrate an exemplary method for fabricating a semiconductor device according to one embodiment of the invention. As shown in FIG. 3, a substrate 100 is provided. According to one embodiment, the substrate 100 may be a semiconductor substrate such as a silicon substrate, a silicon-on-insulator (SOI) substrate, but is not limited thereto. It is understood that the substrate 100 may be composed of other suitable materials such as glass, ceramic, or metals.

According to one embodiment, an etch stop layer 102 is then deposited on the substrate 100. For example, the etch stop layer 102 may comprise silicon nitride, but is not limited thereto. A first dielectric layer 104 is then deposited on the etch stop layer 102. For example, the first dielectric layer 104 may comprise silicon oxide, but is not limited thereto. A hard mask layer 106 is then deposited on the first dielectric layer 104. For example, the hard mask layer 106 may comprise silicon nitride, but is not limited thereto.

Figure 4:
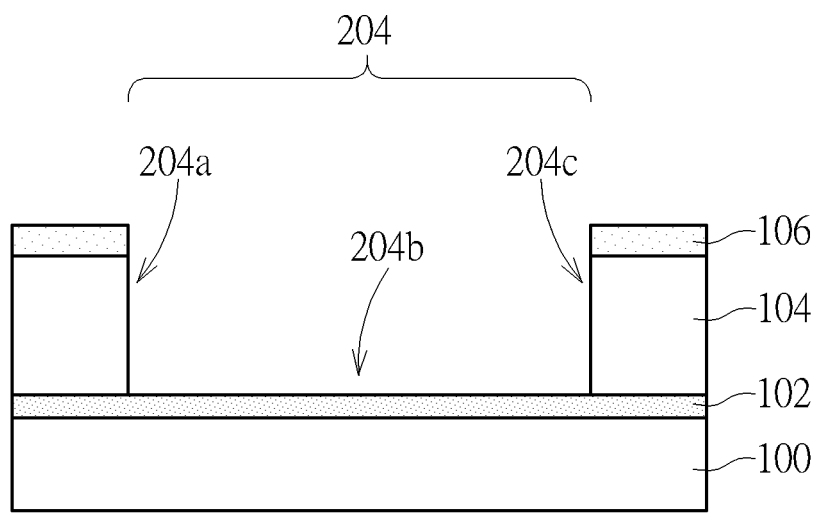

As shown in FIG. 4, a lithographic process and a dry etching process may be performed to form a trench 204 in the hard mask layer 106 and the first dielectric layer 104. The trench 204 has opposite vertical sidewalls 204a and a bottom surface 204b. The bottom surface 204b of the trench 204 is also the exposed top surface of the etch stop layer 102.

Figure 5:
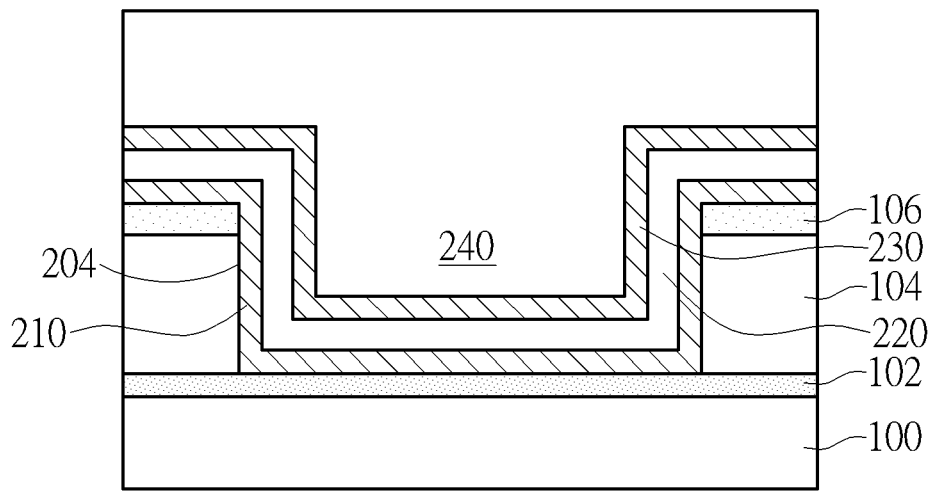

As shown in FIG. 5, a first source/drain electrode layer 210 is conformally deposited on the sidewall 204a and the bottom surface 204b of the trench 204. The first source/drain electrode layer 210 also covers the top surface of the hard mask layer 106 outside the trench 204 at this point. According to one embodiment, the first source/drain electrode layer 210 may comprise conductive materials, for example, metals or polysilicon, but is not limited thereto. According to one embodiment, the first source/drain electrode layer 210 may be deposited by methods known in the art, for example, chemical vapor deposition (CVD), physical vapor deposition (PVD), atomic layer deposition (ALD), or the like.

Subsequently, a second dielectric layer 220 is conformally deposited on the first source/drain electrode layer 210. For example, the second dielectric layer 220 may be a silicon oxide layer, but is not limited thereto. A second source/drain electrode layer 230 such as a metal layer or a polysilicon layer is then conformally deposited on the second dielectric layer 220. A third dielectric layer 240 such as a silicon oxide layer is then deposited on the second source/drain electrode layer 230. The second source/drain electrode layer 230 is insulated from the first source/drain electrode layer 210 by the second dielectric layer 220. The first source/drain electrode layer 210, the second dielectric layer 220, the second source/drain electrode layer 230, and the third dielectric layer 240 together completely fill up the trench 204.

Figure 6:
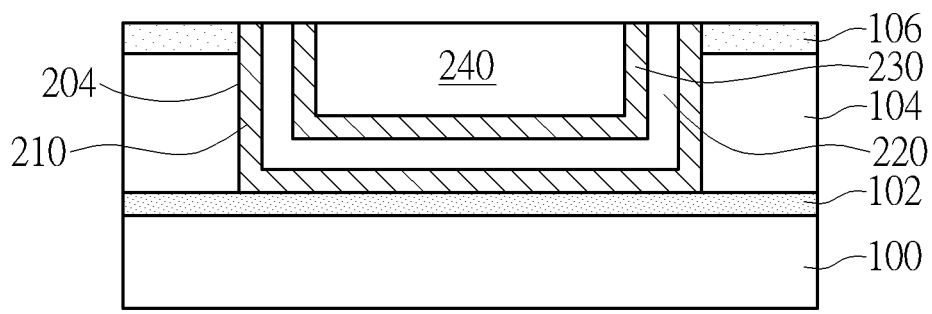

As shown in FIG. 6, subsequently, a chemical mechanical polishing (CMP) process may be performed to planarize the first source/drain electrode layer 210, the second dielectric layer 220, the second source/drain electrode layer 230, and the third dielectric layer 240. After the CMP, the third dielectric layer 240 has a top surface that is flush with a top surface of the hard mask layer 106. The top surface of the first source/drain electrode layer 210, a top surface of the second dielectric layer 220, a top surface of the second source/drain electrode layer 230, a top surface of the third dielectric layer 240, and a top surface of the hard mask layer 106 are coplanar.

Figure 7:
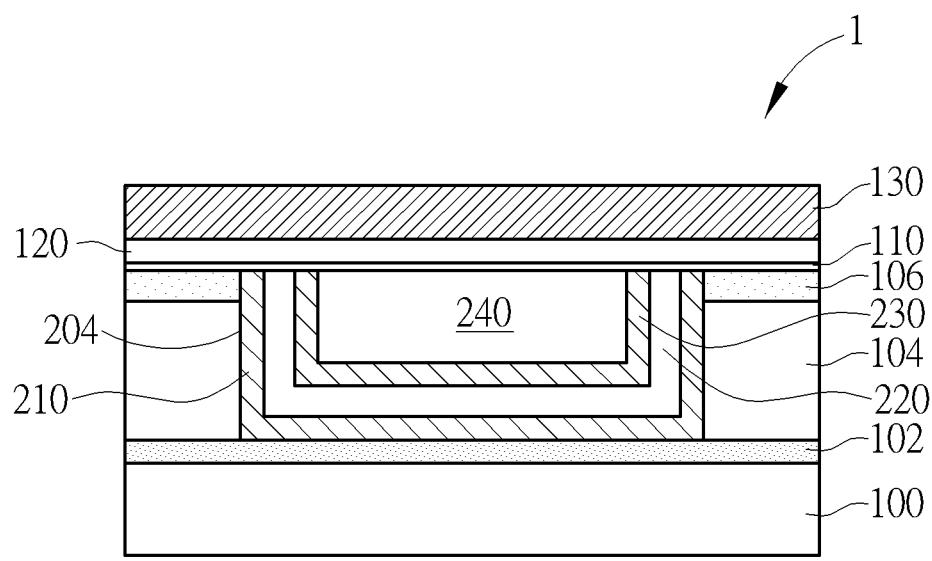

As shown in FIG. 7, a two-dimensional (2D) material layer 110 is conformally coated on the hard mask layer 106, the first source/drain electrode layer 210, the second dielectric layer 220, the second source/drain electrode layer 230, and the third dielectric layer 240. According to one embodiment, the 2D material layer 110 may comprise transition metal dichalcogenide, graphene, or boron nitride, but is not limited thereto. The formation of the 2D material layer 110 is well-known in the art. For example, the 2D material layer 110 may be formed by various coating methods such as spin coating, dip coating, or bar coating. The 2D material layer 110 may have a nanometer-level or nano-scale thickness. Optionally, an annealing process may be performed after coating the 2D material layer 110.

According to one embodiment, the first source/drain electrode layer 210 extends vertically along the sidewall of the trench 204 between the 2D material layer 110 and the etch stop layer 102. The first source/drain electrode layer 210 also extends horizontally along the bottom surface 204b. A top surface of the first source/drain electrode layer 210 is in direct contact with the 2D material layer 110 and a bottom surface of the first source/drain electrode layer 210 is in direct contact with the etch stop layer 102.

According to one embodiment, subsequently, a gate dielectric layer 120 is conformally deposited on the 2D material layer 110. For example, the gate dielectric layer 120 may be a silicon oxide layer, but is not limited thereto. According to one embodiment, a gate electrode 130 is then disposed on the gate dielectric layer 120. For example, the gate electrode 130 may comprise metals or polysilicon, but is not limited thereto.

Figure 8:
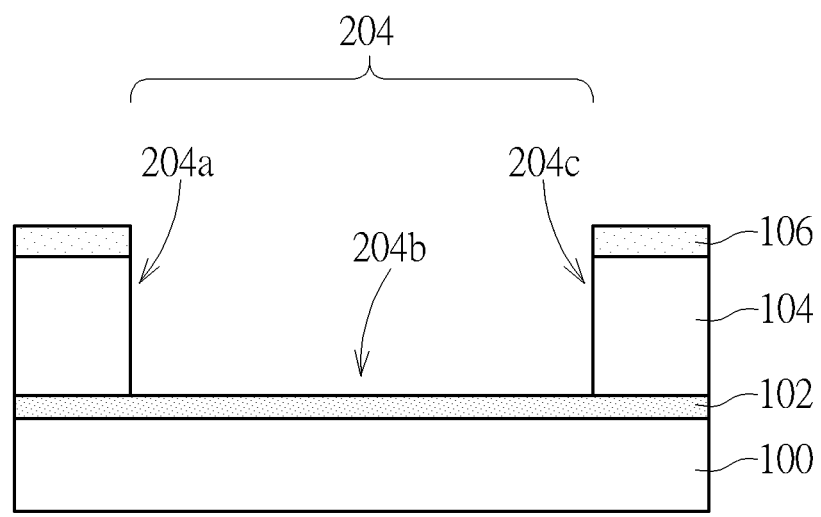
FIG. 8 to FIG. 12 illustrate an exemplary method for fabricating a semiconductor device according to another embodiment of the invention.

Please refer to FIG. 8 to FIG. 12. FIG. 8 to FIG. 12 illustrate an exemplary method for fabricating a semiconductor device according to another embodiment of the invention, wherein like numeral numbers designate like layers, regions, or elements. As shown in FIG. 8, likewise, after the formation of the hard mask layer 106, a trench 204 is etched into the hard mask layer 106 and the first dielectric layer 104. The trench 204 has opposite vertical sidewalls 204a and a bottom surface 204b. The bottom surface 204b of the trench 204 is also the exposed top surface of the etch stop layer 102.

Figure 9:
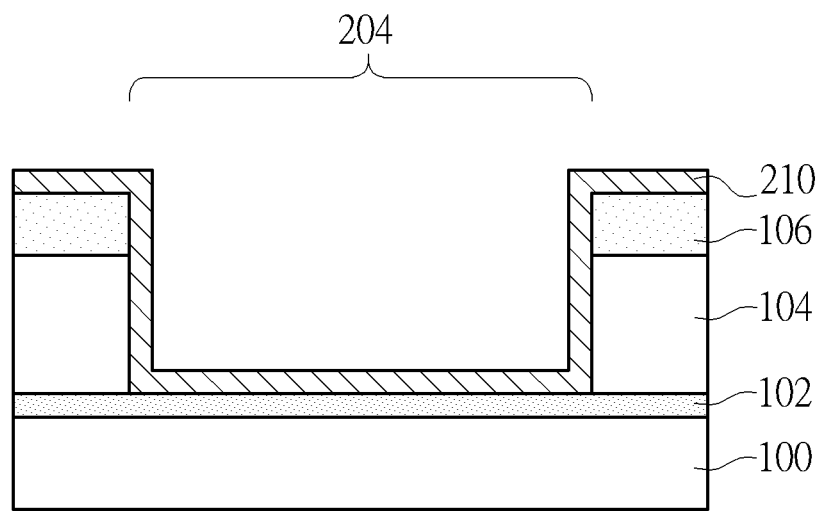

As shown in FIG. 9, a first source/drain electrode layer 210 is conformally deposited on the sidewall 204a and the bottom surface 204b of the trench 204. The first source/drain electrode layer 210 also covers the top surface of the hard mask layer 106 outside the trench 204 at this point. According to one embodiment, the first source/drain electrode layer 210 may comprise conductive materials, for example, metals or polysilicon, but is not limited thereto. According to one embodiment, the first source/drain electrode layer 210 may be deposited by methods known in the art, for example, chemical vapor deposition (CVD), physical vapor deposition (PVD), atomic layer deposition (ALD), or the like.

Figure 10:
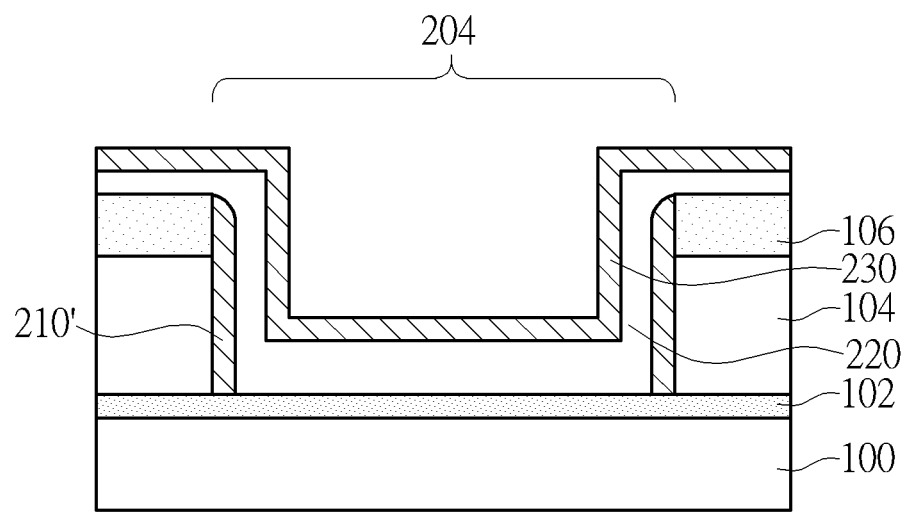

As shown in FIG. 10, subsequently, an anisotropic dry etching process is performed to etch the first source/drain electrode layer 210, thereby forming a conductive, ring-shaped spacer 210' on the sidewall 204a of the trench 204.

Figure 11:
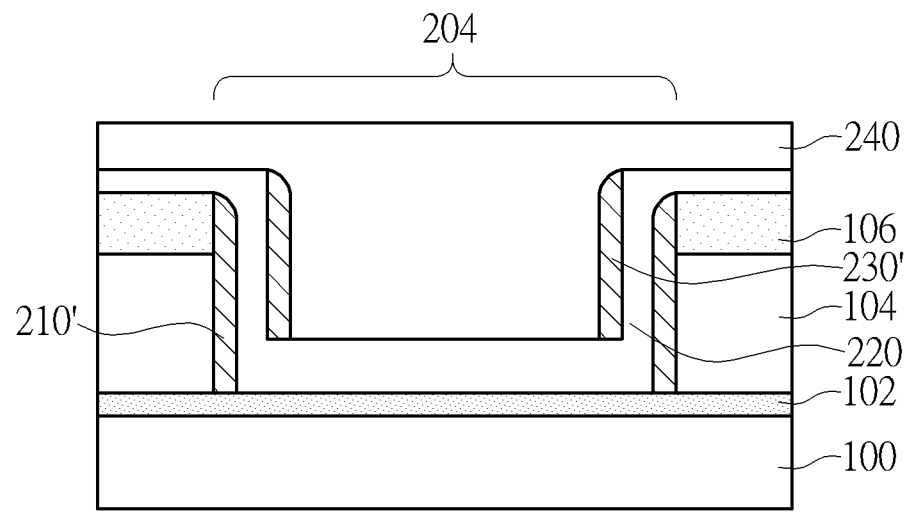

As shown in FIG. 11, a second dielectric layer 220 is conformally deposited on the conductive, ring-shaped spacer 210'. For example, the second dielectric layer 220 may be a silicon oxide layer, but is not limited thereto. A second source/drain electrode layer 230 such as a metal layer or a polysilicon layer is then conformally deposited on the second dielectric layer 220.

Figure 12:
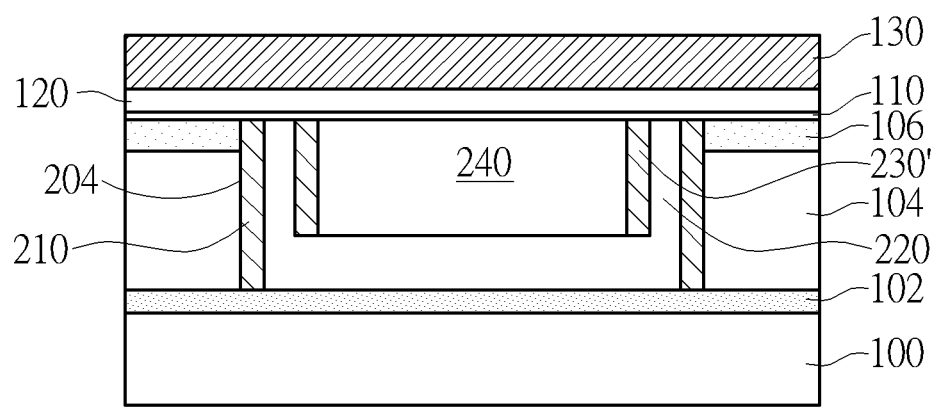

As shown in FIG. 12, subsequently, an anisotropic dry etching process is performed to etch the second source/drain electrode layer 230, thereby forming a conductive, ring-shaped spacer 230' on the sidewall 204a of the trench 204. The conductive, ring-shaped spacer 230' is insulated from the conductive, ring-shaped spacer 210' by the second dielectric layer 220.

Subsequently, a third dielectric layer 240 such as a silicon oxide layer is then deposited into the trench 204 to cover the conductive, ring-shaped spacer 230' and the second dielectric layer 220. The conductive, ring-shaped spacer 210', the second dielectric layer 220, the conductive, ring-shaped spacer 230', and the third dielectric layer 240 together completely fill up the trench 204.

As shown in FIG. 12, subsequently, a chemical mechanical polishing (CMP) process may be performed to planarize the conductive, ring-shaped spacer 210', the second dielectric layer 220, the conductive, ring-shaped spacer 230', and the third dielectric layer 240. After the CMP, the third dielectric layer 240 has a top surface that is flush with a top surface of the hard mask layer 106. The top surface of the conductive, ring-shaped spacer 210', a top surface of the second dielectric layer 220, a top surface of the conductive, ring-shaped spacer 230', a top surface of the third dielectric layer 240, and a top surface of the hard mask layer 106 are coplanar.

A 2D material layer 110 is then conformally coated on the hard mask layer 106, the conductive, ring-shaped spacer 230', the second dielectric layer 220, the conductive, ring-shaped spacer 230', and the third dielectric layer 240. According to one embodiment, the 2D material layer 110 may comprise transition metal dichalcogenide, graphene, or boron nitride, but is not limited thereto. The 2D material layer 110 may have a nanometer-level or nano-scale thickness. Optionally, an annealing process may be performed after coating the 2D material layer 110.

Subsequently, a gate dielectric layer 120 is conformally deposited on the 2D material layer 110. For example, the gate dielectric layer 120 may be a silicon oxide layer, but is not limited thereto. According to one embodiment, a gate electrode 130 is then disposed on the gate dielectric layer 120. For example, the gate electrode 130 may comprise metals or polysilicon, but is not limited thereto.

Figure 13:
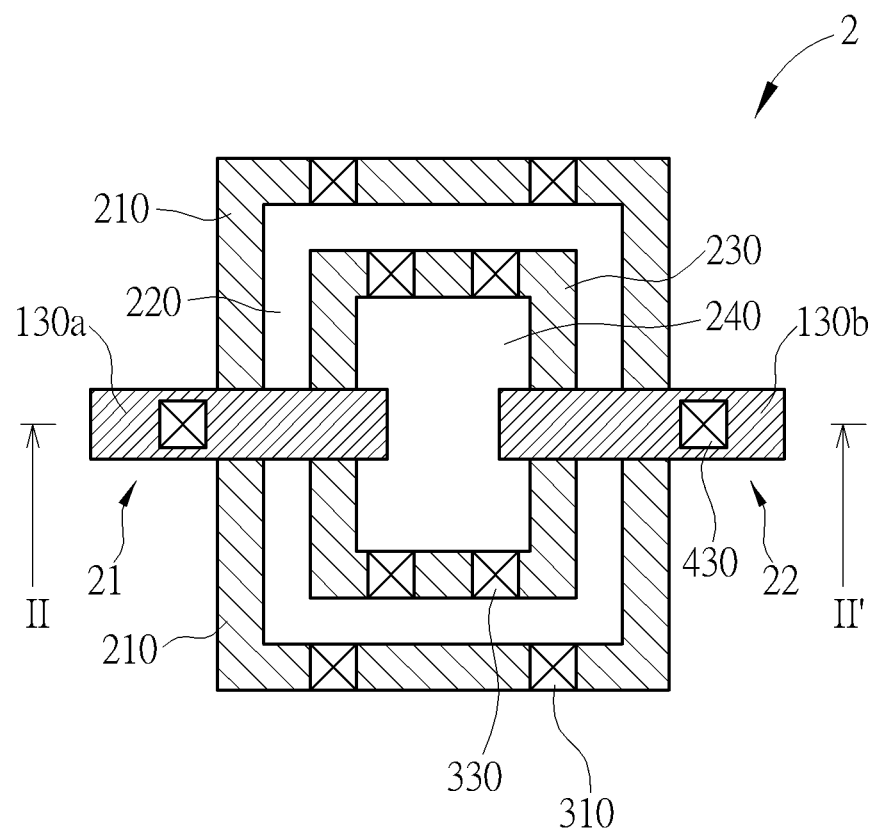
FIG. 13 is a schematic top view showing a semiconductor device according to another embodiment of the invention.
Figure 14:
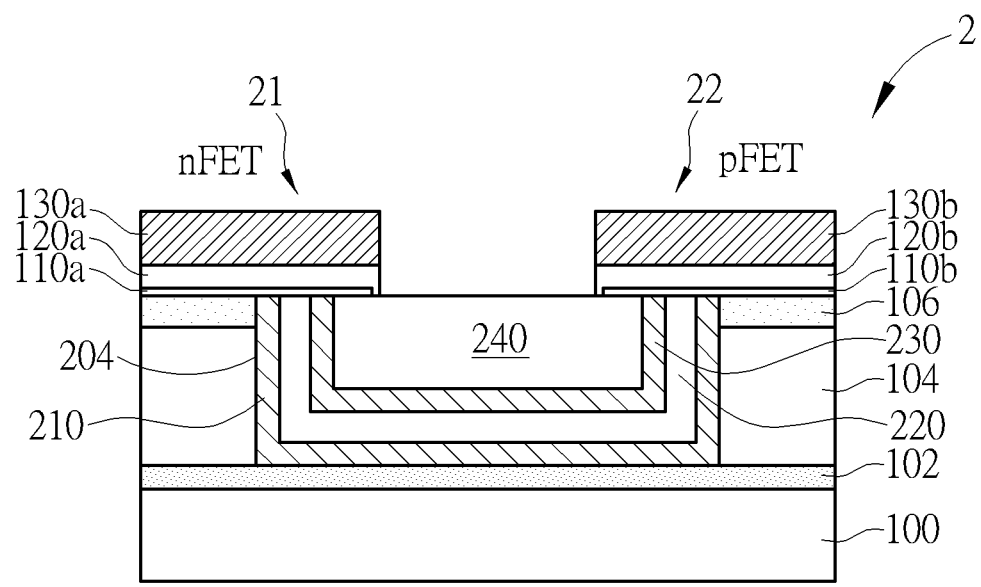
FIG. 14 is a cross-sectional view taken along line II-II' in FIG. 13.

FIG. 13 is a schematic top view showing a semiconductor device according to another embodiment of the invention. FIG. 14 is a cross-sectional view taken along line II-II' in FIG. 13, wherein like numeral numbers designate like layers, regions, or elements. As shown in FIG. 13 and FIG. 14, the semiconductor device 2 may be a transmission gate device. The semiconductor device 2 comprises two field effect transistors (FETs) comprising an n-type FET (nFET) 21 and a p-type FET (pFET) 22. The gate electrode 130a of the nFET 21 is separated from the gate electrode 130b of the pFET 22.

According to one embodiment, the nFET 21 further comprises a gate dielectric layer 120a and an n-type doped 2D material layer 110a. The pFET 22 further comprises a gate dielectric layer 120b and a p-type doped 2D material layer 110b. According to one embodiment, the gate dielectric layer 120a is separated from the gate dielectric layer 120b, and the n-type doped 2D material layer 110a is separated from the p-type doped 2D material layer 110b. The film stack within the trench 204 is identical with that as depicted in FIG. 1 and FIG. 2.

Figure 15:
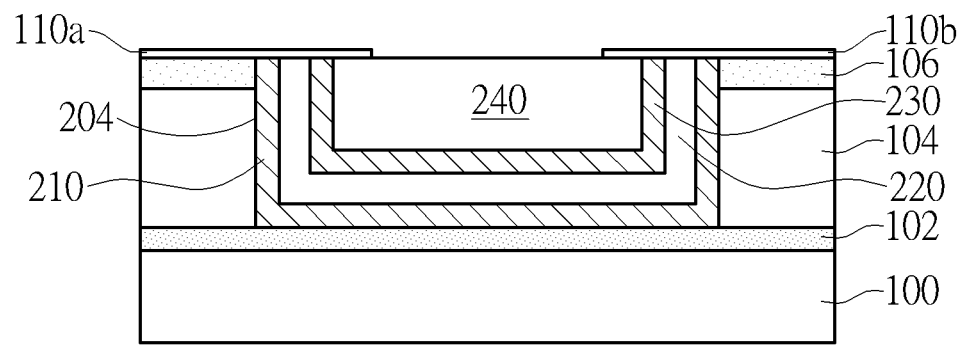
FIG. 15 to FIG. 17 illustrate an exemplary method of fabricating the semiconductor device as depicted in FIG. 13 and FIG. 14.
Figure 16:
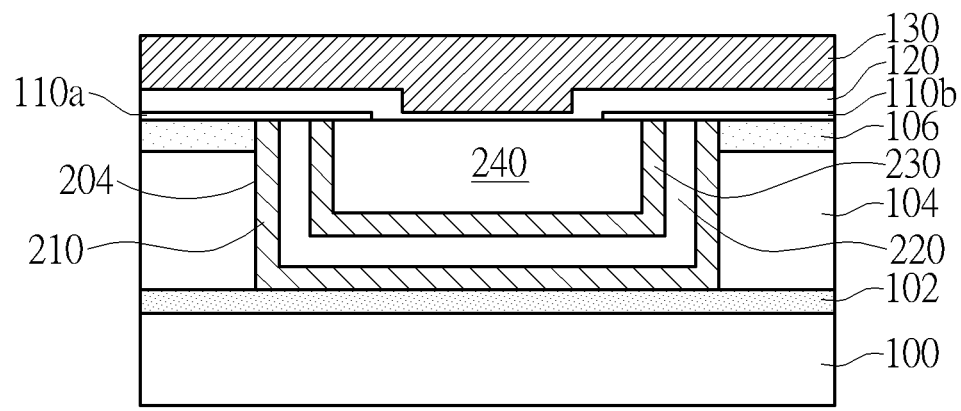
Figure 17:
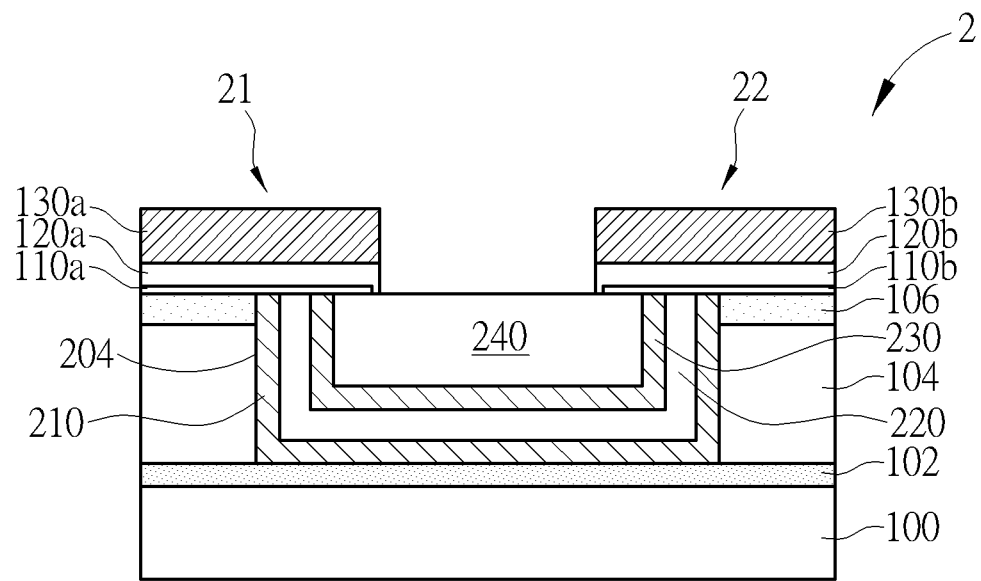

FIG. 15 to FIG. 17 illustrate an exemplary method of fabricating the semiconductor device 2 as depicted in FIG. 13 and FIG. 14. As shown in FIG. 15, after the formation of the film stack within the trench 204 as set forth in FIG. 6, an n-type doped 2D material layer 110a and a p-type doped 2D material layer 110b are formed over the substrate 100. The n-type doped 2D material layer 110a is separated from the p-type doped 2D material layer 110b.

As shown in FIG. 16, a gate dielectric layer 120 is conformally deposited on the n-type doped 2D material layer 110a, the p-type doped 2D material layer 110b, and the third dielectric layer 240. For example, the gate dielectric layer 120 may be a silicon oxide layer, but is not limited thereto. According to one embodiment, a gate electrode 130 is then disposed on the gate dielectric layer 120. For example, the gate electrode 130 may comprise metals or polysilicon, but is not limited thereto.

As shown in FIG. 17, a lithographic process and a dry etching process are then performed to pattern the gate electrode 130 and the gate dielectric layer 120, thereby forming the gate electrode 130a of the nFET 21 and the gate electrode 130b of the pFET 22.

Figure 18:
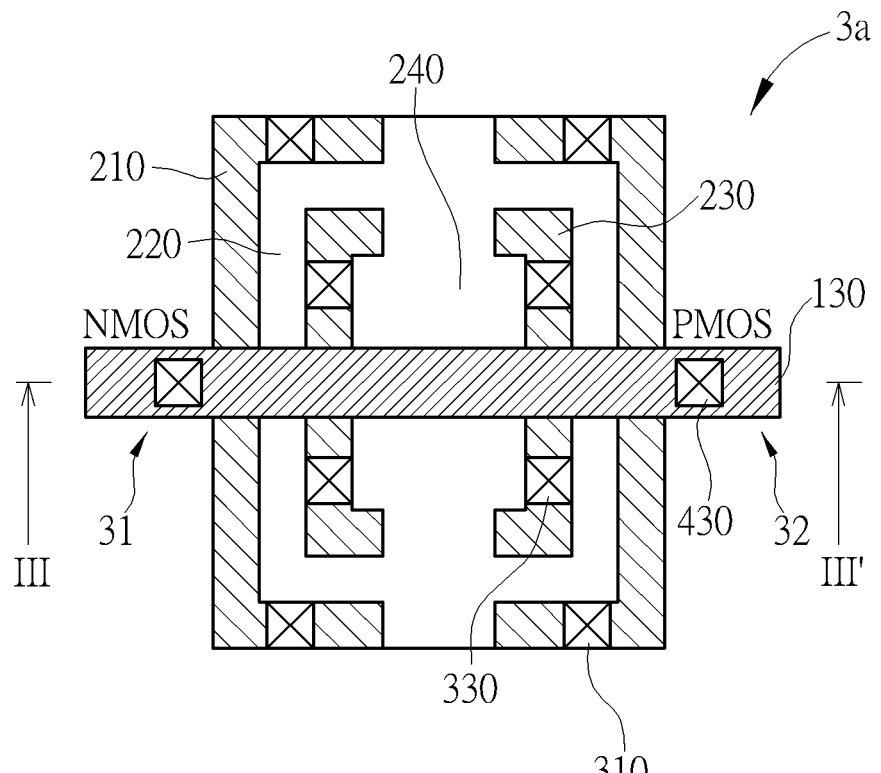
FIG. 18 is a schematic top view showing a semiconductor device according to still another embodiment of the invention.
Figure 19:
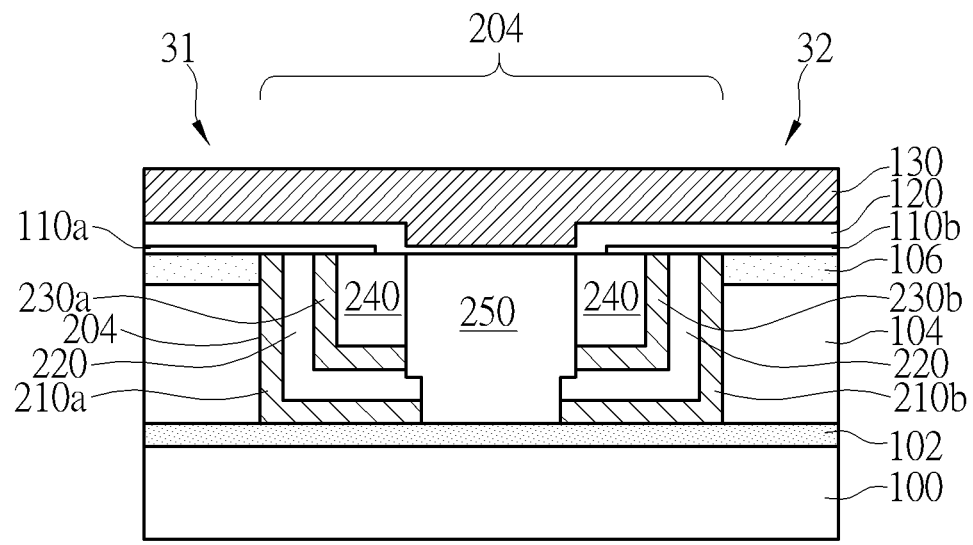
FIG. 19 is a cross-sectional view taken along line III-III' in FIG. 18.

FIG. 18 is a schematic top view showing a semiconductor device according to still another embodiment of the invention. FIG. 19 is a cross-sectional view taken along line in FIG. 18, wherein like numeral numbers designate like layers, regions, or elements. As shown in FIG. 18 and FIG. 19, the semiconductor device 3a may be a CMOS device with a common gate. The semiconductor device 3a comprises an n-type MOS (nMOS) 31 and a p-type MOS (pMOS) 32. The nMOS 31 and the pMOS 32 share one gate electrode 130.

The nMOS 31 comprises a first source/drain electrode layer 210a, a second source/drain electrode layer 230a insulated from the first source/drain electrode layer 210a by the second dielectric layer 220 in the trench 204. An n-type doped 2D material layer 110a is disposed over the first source/drain electrode layer 210a and the second source/drain electrode layer 230a. The pMOS 32 comprises a first source/drain electrode layer 210b, a second source/drain electrode layer 230b insulated from the first source/drain electrode layer 210b by the second dielectric layer 220 in the trench 204. A p-type doped 2D material layer 110b is disposed over the first source/drain electrode layer 210b and the second source/drain electrode layer 230b. The film stack is similar with that depicted in FIG. 6 except that discontinuities are provided between the first source/drain electrode layer 210a and the first source/drain electrode layer 210b and between the second source/drain electrode layer 230a and the second source/drain electrode layer 230b.

Figure 20:
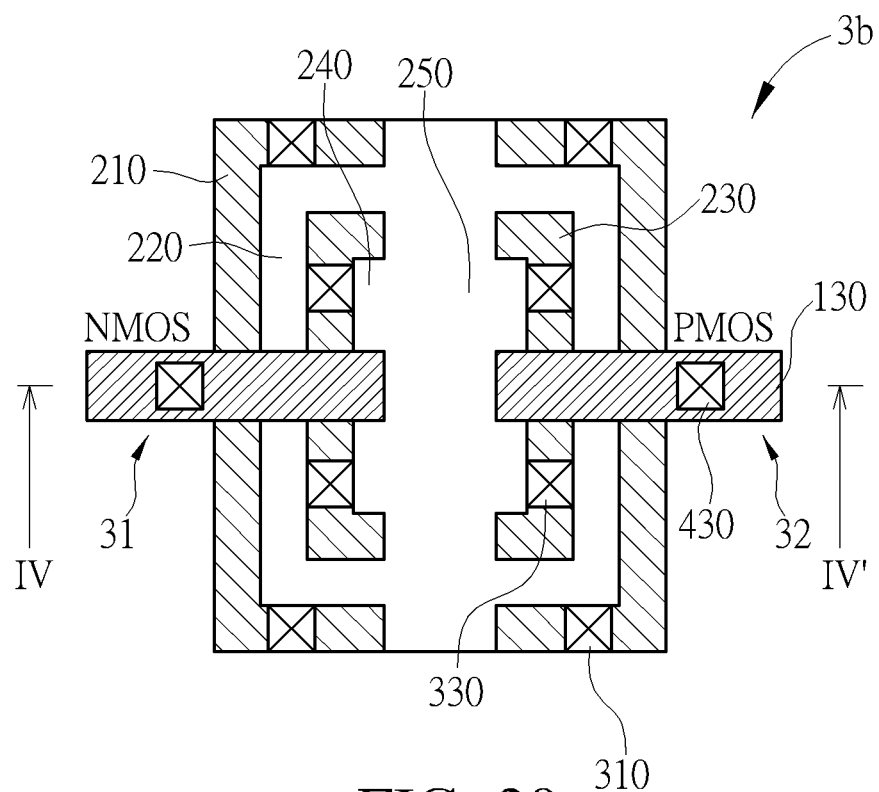
FIG. 20 is a schematic top view showing a semiconductor device according to still another embodiment of the invention.
Figure 21:
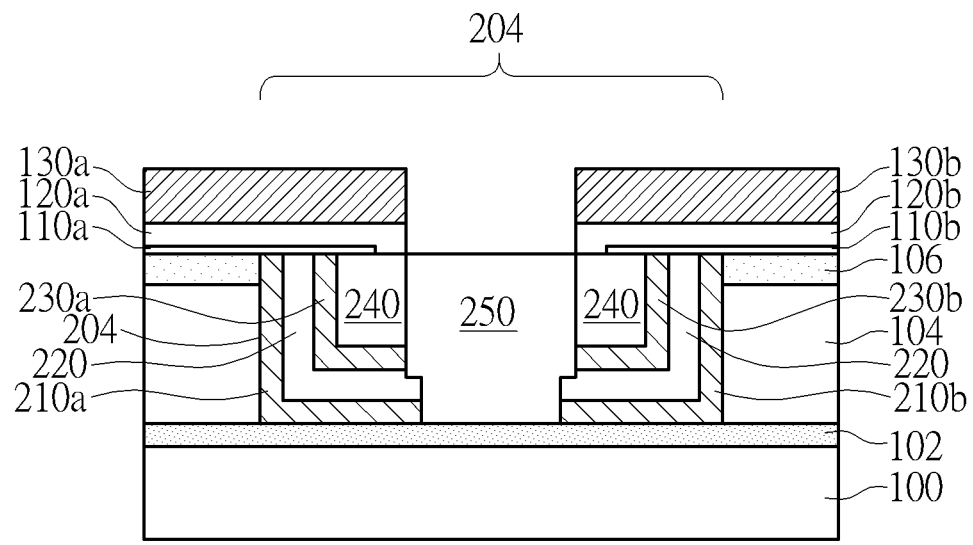
FIG. 21 is a cross-sectional view taken along line IV-IV' in FIG. 20.

FIG. 20 is a schematic top view showing a semiconductor device according to still another embodiment of the invention. FIG. 21 is a cross-sectional view taken along line IV-IV' in FIG. 20, wherein like numeral numbers designate like layers, regions, or elements. As shown in FIG. 20 and FIG. 21, the semiconductor device 3b may be a CMOS device with separated gates. Likewise, the semiconductor device 3b comprises an nMOS 31 and a pMOS 32. The nMOS 31 has its own gate electrodes 130a and the pMOS 32 has its own gate electrodes 130b. That is, the gate electrode 130a of the nMOS 31 is separated from the gate electrode 130b of the pMOS 32.

FIG. 22 to FIG. 29 are schematic, cross-sectional diagrams showing a method for fabricating the semiconductor device 3a as depicted in FIG. 18 and FIG. 19, wherein like numeral numbers designate like layers, regions, or elements.

Figure 22:
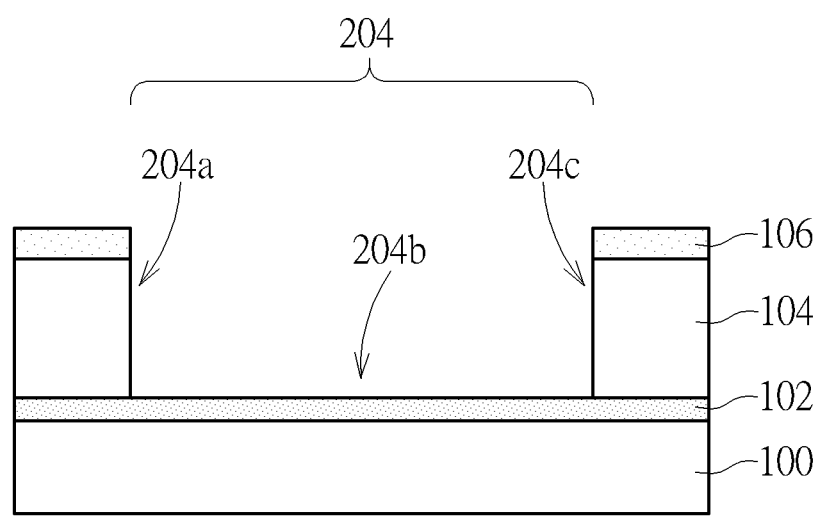
FIG. 22 to FIG. 29 are schematic, cross-sectional diagrams showing a method for fabricating the semiconductor device as depicted in FIG. 18 and FIG. 19.

As shown in FIG. 22, a lithographic process and a dry etching process may be performed to form a trench 204 in the hard mask layer 106 and the first dielectric layer 104. The trench 204 has opposite vertical sidewalls 204a and a bottom surface 204b. The bottom surface 204b of the trench 204 is also the exposed top surface of the etch stop layer 102.

Figure 23:
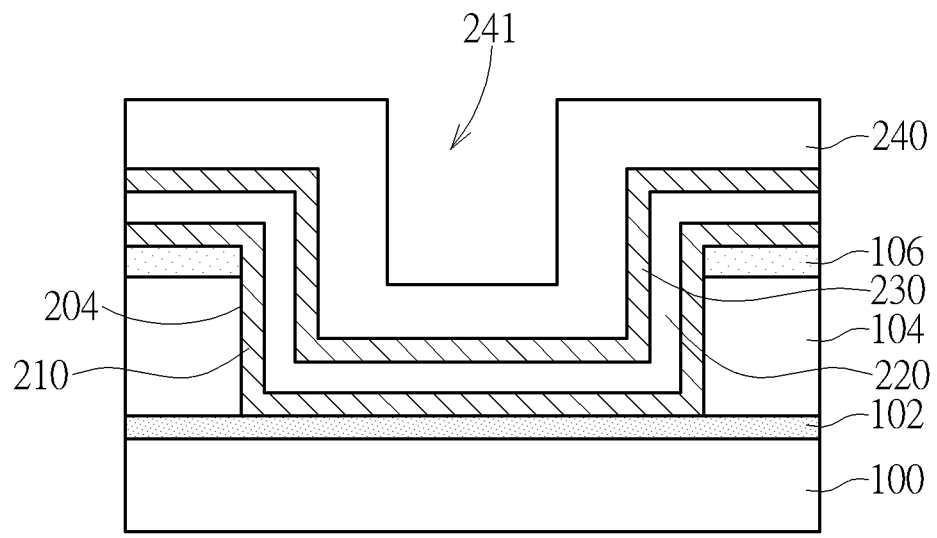

As shown in FIG. 23, a first source/drain electrode layer 210 is conformally deposited on the sidewall 204a and the bottom surface 204b of the trench 204. The first source/drain electrode layer 210 also covers the top surface of the hard mask layer 106 outside the trench 204 at this point. According to one embodiment, the first source/drain electrode layer 210 may comprise conductive materials, for example, metals or polysilicon, but is not limited thereto. According to one embodiment, the first source/drain electrode layer 210 may be deposited by methods known in the art, for example, chemical vapor deposition (CVD), physical vapor deposition (PVD), atomic layer deposition (ALD), or the like.

Subsequently, a second dielectric layer 220 is conformally deposited on the first source/drain electrode layer 210. For example, the second dielectric layer 220 may be a silicon oxide layer, but is not limited thereto. A second source/drain electrode layer 230 such as a metal layer or a polysilicon layer is then conformally deposited on the second dielectric layer 220. A third dielectric layer 240 such as a silicon oxide layer is then conformally deposited on the second source/drain electrode layer 230. The second source/drain electrode layer 230 is insulated from the first source/drain electrode layer 210 by the second dielectric layer 220. At this point, a recess 241 may be formed on the third dielectric layer 240 within the trench 204.

Figure 24:
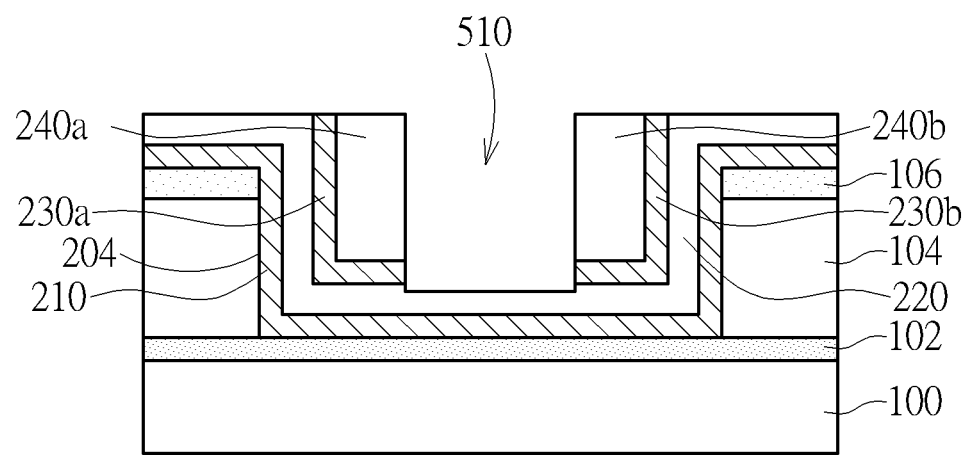

As shown in FIG. 24, the third dielectric layer 240 and the second source/drain electrode layer 230 are subjected to an anisotropic dry etching process so as to form separated second source/drain electrode layers 230a and 230b and separated third dielectric layers 240a and 240b on the second dielectric layer 220. A central opening 510 is formed within the trench 204.

Figure 25:
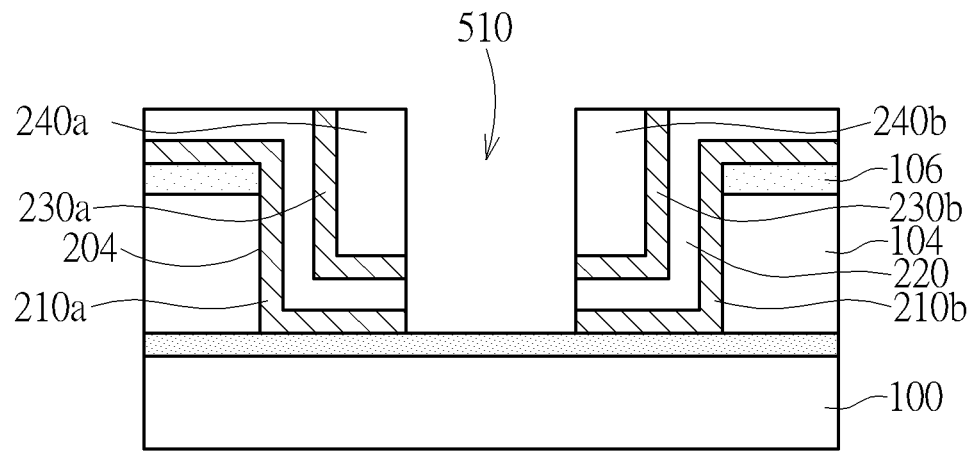

As shown in FIG. 25, through the central opening 510, an etching process may be carried out to etch the second dielectric layer 220 and the first source/drain electrode layer 210, thereby forming separated first source/drain electrode layers 210a and 210b.

Figure 26:
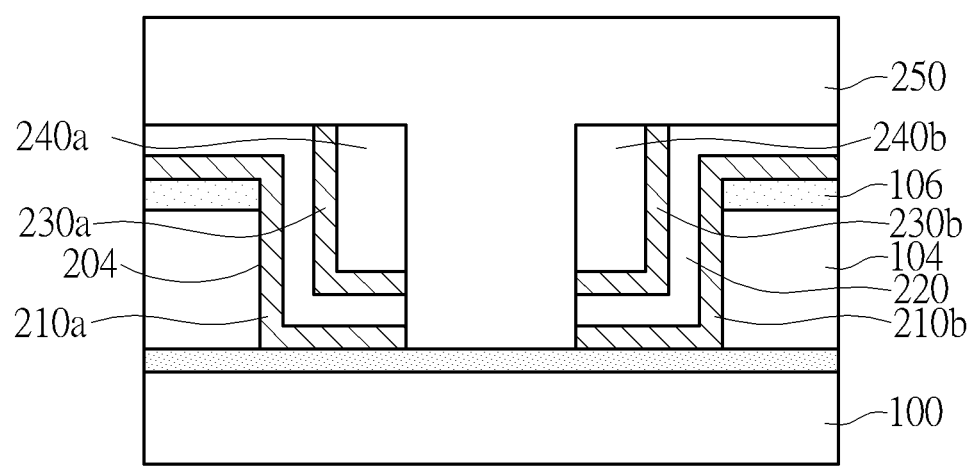

As shown in FIG. 26, a fourth dielectric layer 250 such as a silicon oxide layer may be deposited over the substrate 100 in a blanket manner. The fourth dielectric layer 250 fills up the central opening 510.

Figure 27:
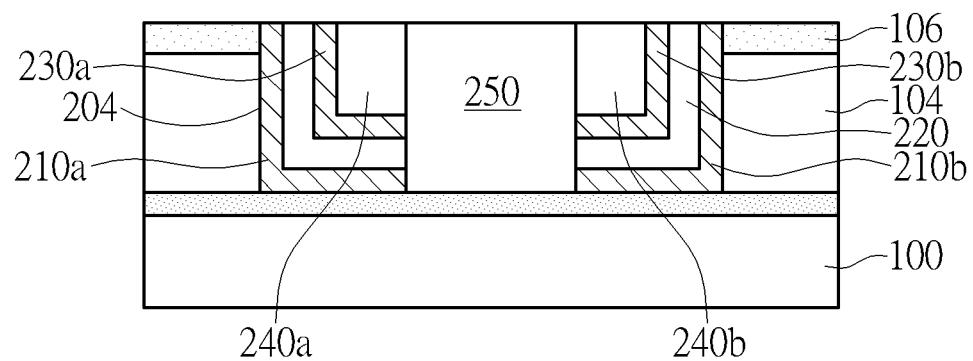

As shown in FIG. 27, the fourth dielectric layer 250 is then subjected to a CMP process. The layers above the hard mask layer 106 are removed so as to form a planar surface.

Figure 28:
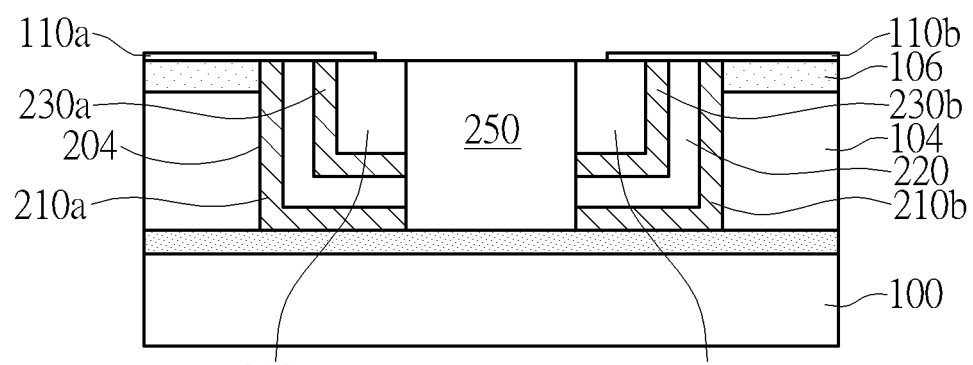

As shown in FIG. 28, an n-type doped 2D material layer 110a and a p-type doped 2D material layer 110b are formed over the substrate 100. The n-type doped 2D material layer 110a is separated from the p-type doped 2D material layer 110b.

Figure 29:
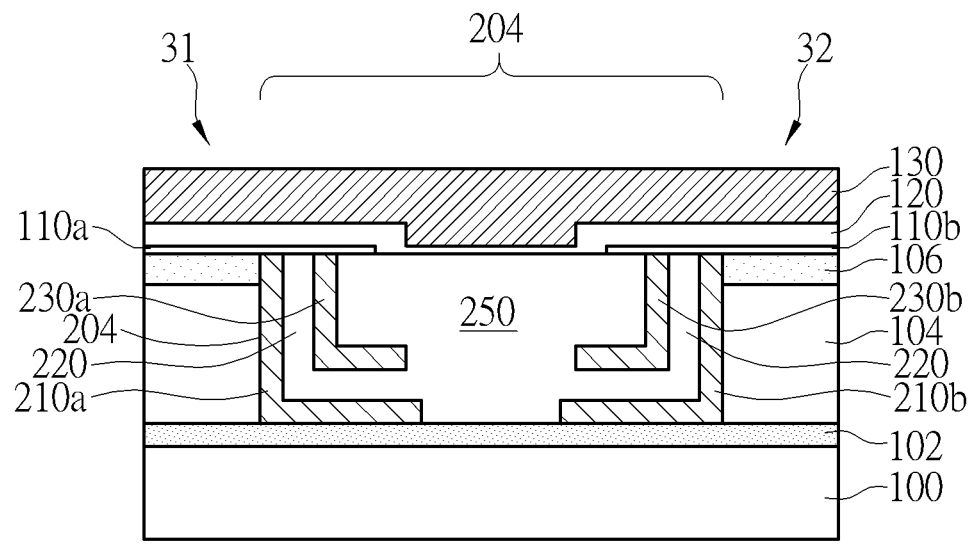

As shown in FIG. 29, a gate dielectric layer 120 is conformally deposited on the n-type doped 2D material layer 110a, the p-type doped 2D material layer 110b, and the third dielectric layer 240. For example, the gate dielectric layer 120 may be a silicon oxide layer, but is not limited thereto. According to one embodiment, a gate electrode 130 is then disposed on the gate dielectric layer 120. For example, the gate electrode 130 may comprise metals or polysilicon, but is not limited thereto.

Figure 30:
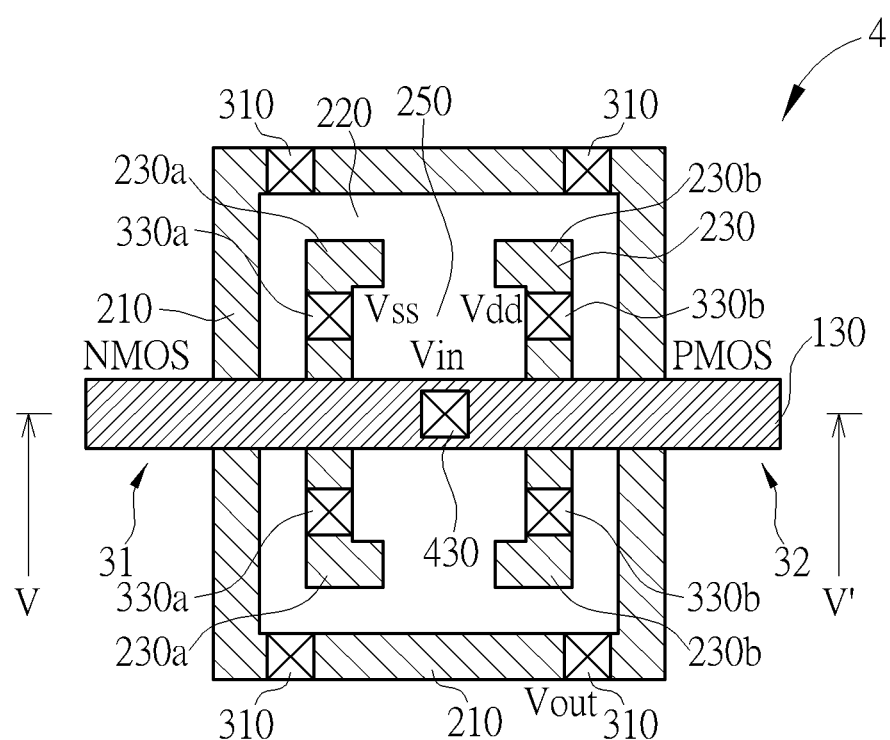
FIG. 30 is a schematic top view showing a semiconductor device according to still another embodiment of the invention.
Figure 31:
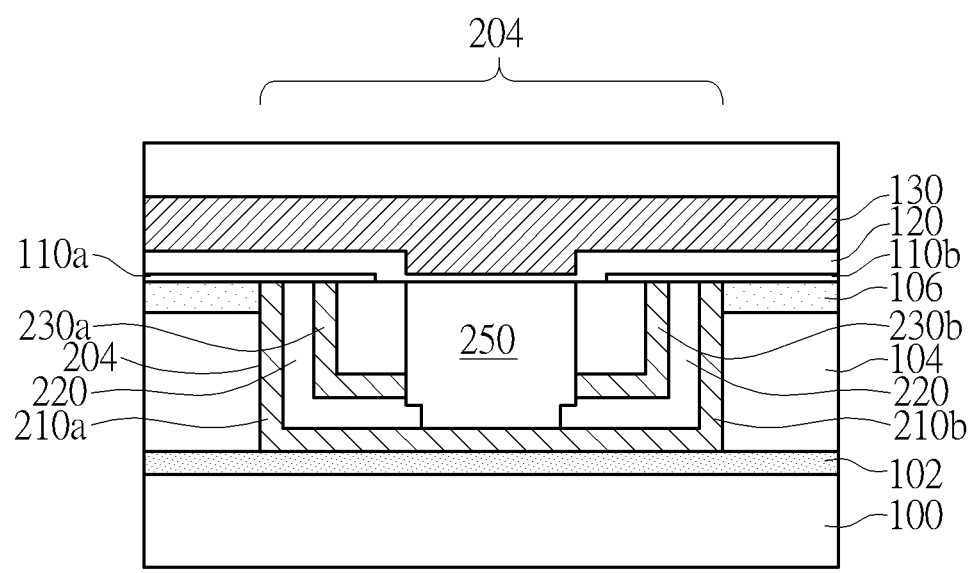
FIG. 31 is a cross-sectional view taken along line V-V' in FIG.

FIG. 30 is a schematic top view showing a semiconductor device according to still another embodiment of the invention. FIG. 31 is a cross-sectional view taken along line V-V' in FIG. 30, wherein like numeral numbers designate like layers, regions, or elements. As shown in FIG. 30 and FIG. 31, the semiconductor device 4 may be an inverter design with common gate. The layer stack structure is similar to that as depicted in FIG. 19, except that only the second source/drain electrode layer 230 is divided into two separated portions: the second source/drain electrode layers 230a and 230b.

As shown in FIG. 30, exemplary contact elements 310, 330a, 330b and 430 are disposed on the first source/drain electrode layer 210, the second source/drain electrode layer 230a, the second source/drain electrode layer 230b, and the gate electrode 130, respectively. For example, the contact elements 310 may be coupled to $V_{out}$ signal, the contact elements 330a may be coupled to $V_{ss}$ signal, the contact elements 330b may be coupled to $V_{dd}$ signal, and the contact element 430 may be coupled to $V_{in}$ signal.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a substrate;
   a first dielectric layer on the substrate;
   a hard mask layer on the first dielectric layer;
   a trench in the hard mask layer and the first dielectric layer;
   a first source/drain electrode layer on a sidewall of the trench;
   a second dielectric layer on the first source/drain electrode layer in the trench;
   a second source/drain electrode layer on the second dielectric layer in the trench, wherein both of the first source/drain electrode layer and the second source/drain electrode layer extend along the sidewall and a bottom of the trench;
   a third dielectric layer on the second source/drain electrode layer in the trench;
   an n-type field-effect transistor (nFET) disposed over the trench; and
   a p-type field-effect transistor (pFET) disposed over the trench and spaced apart from the nFET.

2. The semiconductor device according to claim 1, wherein the nFET comprises:
   a first two-dimensional (2D) material layer overlying the hard mask layer, the first source/drain electrode layer, the second dielectric layer, the second source/drain electrode layer, and the third dielectric layer;
   a first gate dielectric layer on the first 2D material layer; and
   a first gate electrode on the first gate dielectric layer.

3. The semiconductor device according to claim 2, wherein the pFET comprises:
   a second two-dimensional (2D) material layer overlying the hard mask layer, the first source/drain electrode layer, the second dielectric layer, the second source/drain electrode layer, and the third dielectric layer, wherein the second 2D material layer is not contiguous with the first 2D material layer;
   a second gate dielectric layer on the second 2D material layer; and
   a second gate electrode on the second gate dielectric layer.

4. The semiconductor device according to claim 3, wherein the second gate dielectric layer is not contiguous with the first gate dielectric layer.

5. The semiconductor device according to claim 3, wherein the second gate electrode is not contiguous with the first gate electrode.

6. The semiconductor device according to claim 3, wherein the first 2D material layer and the second 2D material layer comprise transition metal dichalcogenide, graphene, or boron nitride.

7. The semiconductor device according to claim 3, wherein a top surface of the first source/drain electrode layer is in direct contact with the first 2D material layer and the second 2D material layer.

8. The semiconductor device according to claim 1 further comprising:
   an etch stop layer between the substrate and the first dielectric layer.

9. The semiconductor device according to claim 8, wherein a bottom surface of the first source/drain electrode layer is indirect contact with the etch stop layer.

10. The semiconductor device according to claim 1, wherein the top surface of the first source/drain electrode layer, a top surface of the second dielectric layer, a top surface of the second source/drain electrode layer, a top surface of the third dielectric layer, and a top surface of the hard mask layer are coplanar.

11. The semiconductor device according to claim 1, wherein the first source/drain electrode layer, the second dielectric layer, the second source/drain electrode layer, and the third dielectric layer completely fill up the trench.

12. The semiconductor device according to claim 1, wherein the first source/drain electrode layer is insulated from the second source/drain electrode layer by the second dielectric layer.

13. The semiconductor device according to claim 12, wherein the first source/drain electrode layer and the second source/drain electrode layer are ring shaped and are concentrically arranged in the trench around the third dielectric layer.

14. A semiconductor device, comprising:
a substrate;
a first dielectric layer on the substrate;
a hard mask layer on the first dielectric layer;
a trench in the hard mask layer and the first dielectric layer;
a first source/drain electrode layer on a sidewall of the trench;
a second dielectric layer on the first source/drain electrode layer in the trench;
a second source/drain electrode layer on the second dielectric layer in the trench, wherein both of the first source/drain electrode layer and the second source/drain electrode layer extend along the sidewall and a bottom of the trench;
a third dielectric layer on the second source/drain electrode layer in the trench;
an n-type field-effect transistor (nFET) disposed over the trench; and
a p-type field-effect transistor (pFET) disposed over the trench and spaced apart from the nFET, wherein the nFET and the pFET share one common gate electrode spanning the trench.

15. The semiconductor device according to claim 14, wherein the first source/drain electrode layer, the second dielectric layer, and the second source/drain electrode layer are cut through in the trench such that the first source/drain electrode layer of the nFET is separated from the first source/drain electrode layer of the pFET and the second source/drain electrode layer of the nFET is separated from the second source/drain electrode layer of the pFET.

16. A semiconductor device, comprising:
a substrate;
a first dielectric layer on the substrate;
a hard mask layer on the first dielectric layer;
a trench in the hard mask layer and the first dielectric layer;
a first source/drain electrode layer on a sidewall of the trench;
a second dielectric layer on the first source/drain electrode layer in the trench;
a second source/drain electrode layer on the second dielectric layer in the trench, wherein both of the first source/drain electrode layer and the second source/drain electrode layer extend along the sidewall and a bottom of the trench;
a third dielectric layer on the second source/drain electrode layer in the trench;
an n-type field-effect transistor (nFET) disposed over the trench; and
a p-type field-effect transistor (pFET) disposed over the trench and spaced apart from the nFET, wherein the nFET and the pFET share one common gate electrode spanning the trench, wherein the nFEP and the pFET are configured to form an inverter.

17. The semiconductor device according to claim 16, wherein the second source/drain electrode layer is cut through in the trench such that the second source/drain electrode layer of the nFET is separated from the second source/drain electrode layer of the pFET.

18. The semiconductor device according to claim 17, wherein only the second source/drain electrode layer is divided into two separated first portion and second portion in the trench.

19. The semiconductor device according to claim 16, wherein a first contact element, a second contact element, a third contact element, and a fourth contact element are disposed on the first source/drain electrode layer, the first portion of the second source/drain electrode layer, the second portion of the second source/drain electrode layer, and the common gate electrode, respectively.

20. The semiconductor device according to claim 19, wherein the first contact element is coupled to a $V_{out}$ signal, the second contact element is coupled to a $V_{ss}$ signal, the third contact element is coupled to a $V_{dd}$ signal, and the fourth contact element is coupled to a $V_{in}$ signal.

* * * * *